United States Patent [19]
Marsh

[11] 3,964,907
[45] June 22, 1976

[54] METHOD FOR THE PREPARATION OF RELIEF PRINTING MASTERS
[75] Inventor: Dana G. Marsh, Rochester, N.Y.
[73] Assignee: Xerox Corporation, Stamford, Conn.
[22] Filed: Sept. 2, 1975
[21] Appl. No.: 609,339

Related U.S. Application Data
[63] Continuation-in-part of Ser. No. 415,288, Nov. 12, 1973, abandoned.

[52] U.S. Cl. .................................. 96/35; 96/1.4; 96/28; 96/35.1; 96/36.3; 96/115 R; 204/159.21
[51] Int. Cl.² .................. G03G 5/00; G03G 1/68; B31B 1/76
[58] Field of Search............. 96/35, 35.1, 36, 115 R; 204/159.21

[56] References Cited
UNITED STATES PATENTS
2,892,712   6/1959   Plambeck ............................ 96/36.3
3,558,311   1/1971   Delzeme et al. ..................... 96/35.1
3,779,778  12/1973   Smith et al. ......................... 96/115 R Primary Examiner—Jack P. Brammer
Attorney, Agent, or Firm—James J. Ralebate; James P. O'Sullivan; Jerome L. Jeffers

[57] ABSTRACT

Disclosed is a method for the preparation of a relief printing master which is based on irradiation of a film of a composition comprising a. a degradable polymer containing segments characterized by the structural formula

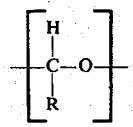

wherein R is H, an alkyl radical of 1 to 6 carbon atoms, a chlorine or fluorine substituted alkyl radical of 1 to 6 carbon atoms or a cyano substituted aliphatic hydrocarbon radical of 1 to 5 carbon atoms, and b. a photosensitizer which upon exposure to actinic radiation assumes a $^3(n, \pi^*)$ or a $^1(n, \pi^*)$ state.

The polymer and photosensitizer combination, which is in the form of a thin film upon a suitable substrate, is exposed in an imagewise manner to actinic radiation to thereby degrade the polymer. Upon such degradation, depressions are formed in the exposed areas thereby rendering the exposed film suitable for use as a relief printing master.

13 Claims, 1 Drawing Figure

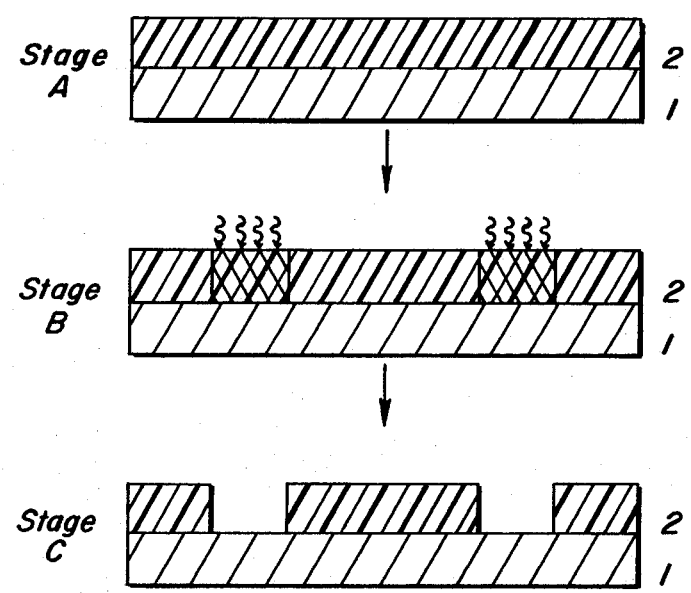

METHOD FOR THE PREPARATION OF RELIEF PRINTING MASTERS

This application is a continuation-in-part of co-pending application Ser. No. 415,288, filed Nov. 12, 1973, and now abandoned.

BACKGROUND OF THE INVENTION

Processes for preparing relief images which embody photodegradation of a synthetic organic material are known. For example, it is disclosed in U.S. Pat. No. 2,892,712 (Example VII) that a film of formaldehyde polymer coated with a thin layer of omega, omega-dibromoacetophenone was irradiated with ultraviolet light and baked at 105°C. to provide a sheet having a letter text incised into the surface of the film. This system, which relies upon the ability of the dibromoacetophenone to release Br· radicals which abstract hydrogen atoms from the polymer backbone, could not be used with polyaldehydes other than the difficutly degraded polyformaldehyde since dibromoacetophenone's great reactivity would cause degradation in the dark at normal temperatures. Only by maintaining such a plate at considerably below room temperature could premature degradation be avoided with this sensitizer.

It would be desirable, and it is an object of this invention, to provide a novel method for the preparation of relief printing masters.

A further object is to provide such a method which relies on the ability of polyaldehydes, e.g. poly(acetaldehyde), in admixture with certain photosensitizers to degrade upon exposure to actinic radiation.

Another object is to provide such a process which employs a photosensitizer which does not release halide radicals.

An additional object is to provide such a process in which the master is made by irradiating a film of the polyaldehyde and photosensitizer which film can be stored at ordinary temperatures without substantial degradation prior to exposure.

SUMMARY OF THE INVENTION

The present invention is a method for the preparation of a relief printing master by imagewise exposure to actinic radiation of a printing plate having on its surface a film of a photodegradable polymer in combination with a photosensitizer.

The polymer contains segments characterized by the structural formula:

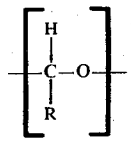

wherein R is H, an alkyl radical of 1 to 6 carbon atoms, a chlorine or fluorine substituted aliphatic hydrocarbon of 1 to 6 carbon atoms or a cyano substituted aliphatic hydrocarbon radical of 1 to 5 carbon atoms.

The photosensitizer is selected from those compositions which upon exposure to actinic radiation assume a $^3(n, \pi^*)$ or $^1(n, \pi^*)$ state.

DETAILED DESCRIPTION

Polymers which can be used in the present invention include those compositions which are prepared by the polymerization of aldehydes to give polymers which correspond to the formula previously set out.

When aldehydes which contain alkyl groups of 1 to 6 carbon atoms attached to the carbonyl carbon atom are polymerized, polymers result in which the R moiety corresponds to the alkyl group of the aldehyde. Examples of aldehydes which contain such moieties include acetaldehyde, propionaldehyde, n-butyraldehyde, isobutraldehyde, valeraldehyde and heptaldehyde. The R moiety may also be H as is the case with poly(formaldehyde).

Alternatively, the aldehyde may contain a chlorinated or fluorinated aliphatic hydrocarbon radical of from 1 to 6 carbon atoms to provide a polyaldehyde in which the R moiety corresponds to the group attached to the carbonyl carbon of the aldehyde. Examples of such aldehydes include chloroacetaldehyde, dichloroacetaldehyde, chloropropionaldehyde, chlorobutyraldehyde, chloropentaldehyde, chlorovaleraldehyde, chloroheptaldehyde, trifluoroacetaldehyde, trifluoropropionaldehyde, heptafluorobutyraldehyde, chloro-difluoroacetaldehyde and fluoroheptaldehyde.

In addition, aldehydes which contain cyano substituted aliphatic hydrocarbon radicals containing from 1 to 5 carbon atoms attached to the carbonyl carbon atoms can be polymerized to form degradable polymers useful in the process of the present invention. Examples of these aldehydes include cyanoacetaldehyde, beta-cyanopropionaldehyde, cyanopentaldehyde and cyanovaleraldehyde.

When homopolymers of the above-described aldehydes are used in the process, the degradable polymer can be represented by the formula:

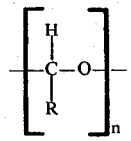

wherein R is as defined above and n is a number representing the degree of polymerization. The degree of polymerization of the homopolymer, i.e. n, must be sufficiently great to provide a non-tacky film when the polymer is cast upon a substrate. The maximum degree of polymerization is not critical and may be as high as the realities of polymerization of the aldehyde permit. In general, those polyaldehydes characterized by the foregoing formula in which n is a number within the range of from 20 to 20,000 are preferred for use in the instant invention.

In addition to homopolymers of the described aldehydes, copolymers and block copolymers containing degradable segments characterized by the foregoing formula can be employed in the process of the instant invention. For example, copolymers and block copolymers may be prepared from one or more of the aldehydes previously described and other polymerizable constituents such as styrene, isoprene, α-methylstyrene, methylmethacrylate, phenyl isocyanate and ethyl isocyanate. In addition, the degradable segments may occur as side chains appended from the backbone of another polymer. Normally, the degree of polymerization of copolymers will be the same as that for homopolymers.

The degradable polymer is combined with a photosensitizer which is capable upon exposure to actinic radiation of assuming a $^3(n, \pi^*)$ or $^1(n, \pi^*)$ state. Many compositions are available which upon irradiation assume such a state and are thereby able to extract a hydrogen atom from the polymer backbone. In general, five classes of compositions are preferred for use as the photosensitizer. These classes are:

1. Carbonyl compounds with reactive $^3(n, \pi^*)$ states such as for example, benzophenone, 2-tert-butylbenzophenone, 4-aminobenzophenone, and 4-phenylbenzophenone; substituted acetophenones, e.g. 4-methoxyacetophenone, and aldehydes, e.g. benzaldehyde and anisaldehyde.

2. Thiocarbonyl compounds such as for example, thiobenzophenone, 4,4'-dimethoxythiobenzophenone, substituted thiobenzophenones, thioacetophenone and substituted thioacetophenones.

3. Aromatic nitro compounds having reactive $^3(n, \pi^*)$ states such as nitrobenzene and 1,2-dinitro-3,4,5,6-tetramethylbenzene.

4. Arylimines and alkylimines having reactive $^3(n, \pi^*)$ states such as N-alkylbenzophenoneimine and benzophenone-N-hexyl imine.

5. Aromatic amines having reactive $^1(n, \pi^*)$ states such as acridine and phenazine.

The reactivity of compositions having a lowest $^3(n, \pi^*)$ state and their ability to abstract hydrogen atoms is understood by those skilled in the art and is more fully described by J. G. Calvert and J. M. Pitts, Jr. in *Photochemistry;* John Wiley and Co., 1966. Those compositions having $^1(n, \pi^*)$ states are more fully described in *Photochemistry, Specialist Periodical Reports,* Vols. I and II, The Chemical Society, Burlington House, London.

The printing plates of the present invention are prepared by mixing the degradable polymer and photosensitizer in a suitable solvent and applying the so-formed solution to a substrate. The amount of photosensitizer used may vary widely provided that at least an effective amount is employed. An effective amount, as used herein, is defined as that amount of photosensitizer which will cause the rate of degradation of the polymer to increase to a noticeable extent over the rate at which the polymer containing no photosensitizer will degrade. The maximum amount will normally be determined by the compatibility of the polymer and the photosensitizer since at very high levels excess photosensitizer will tend to crystallize out. In general, the photosensitizer will account for from 0.01 to 10 weight percent of the polymer with an amount of from 0.1 to 1 weight percent being preferred.

Suitable solvents for use in preparing the films of polymer/photosensitizer include those organic compositions which will dissolve both constituents and are sufficiently volatile to be readily evaporated from the solutes. Solvents which may be used include tetrahydrofuran, benzene, toluene, acetone, chloroform and chlorobenzene. The solution containing the polymer and photosensitizer is applied to the substrate such as by spraying, drawing, spinning or dip coating and the solvent evaporated to leave a continuous film of the polymer having photosensitizer dispersed therein on the substrate.

The substrate can be of any substance having sufficient rigidity to support the film. Preferably, the substrate is made of a material and has a thickness which will provide a flexible plate having sufficient durability to stand up to the rigors encountered during the printing process. Thus, sheets of metals such as aluminum, zinc, stainless steel and brass having thicknesses of from about 4 to 10 mils provide ideal substrates.

After evaporation of the solvent, the printing plate which comprises the substrate having a film of the polymer/photosensitizer on its surface is ready for imaging. This is accomplished by exposing the plate to actinic radiation in an imagewise manner such as through a stencil or photographic negative or positive. As used herein, actinic radiation is intended to refer to electromagnetic radiation of a wavelength which will excite the photosensitizer from the ground state to the $^3(n, \pi^*)$ or $^1(n, \pi^*)$ state. The wavelength of radiation which will cause such excitation will vary with the photosensitizer being used. The carbonyl compounds are normally responsive to ultraviolet radiation whereas thiocarbonyl compounds are excited by light in the visible of near UV part of the spectra. When benzophenone is being used as the photosensitizer, radiation in the ultraviolet range is employed with UV light having wavelengths from 250 to 370 nm. being preferred.

The manner in which the plate is imaged is illustrated by the drawing wherein the figure represented by Stage A illustrates the plate before exposure in which area 1 is the substrate and area 2 is the film upon its surface. Stage B of the drawing illustrates exposure of the plate in an imagewise fashion.

It has been observed that upon irradiation the exposed areas of the film become soft and tacky and that depressions appear on the surface area of the film. These depressions, which normally are of a depth less than the thickness of the film, may be deepened by using the exposed plate as a relief printing master thereby contacting the plate with paper or some other suitable surface. Such contact, which is usually repeated several times, removes the tacky polymer from the plate and leaves depressions through the entire thickness of the film down to the substrate as is illustrated by Stage C of the drawing.

The exposure time will vary widely depending upon the relative concentrations of degradable polymer and photosensitizer in the film, the intensity and wavelength of the ultraviolet light, thickness of the film and properties of the substrate. Thus, the optimum exposure time for a given plate in order to achieve the desired amount of degradation may require some routine experimentation, but would in no way require the application of inventive skill. Typically, a period of exposure between 10 and 600 seconds will be sufficient for purposes of practicing the process of the invention.

While the process of the instant invention is not predicated upon any particular theory of operation, it is believed that degradation occurs due to the fact that upon irradiation the photosensitizer is excited to its first electronically excited singlet state $^1(n, \pi^*)$ and intersystem crossing occurs with unit efficiency to the lowest electronically excited triplet state $^3(n, \pi^*)$. The excited photosensitizer either, $^1(n, \pi^*)$ or $^3(n, \pi^*)$, abstracts an H atom from the polyaldehyde backbone and forms a free radical species on a carbon atom. At this point, chain cleavage occurs as the result of the rearrangement of electrons in a carbon-oxygen sigma bond and polymer degradation occurs whereby the molecular weight of the polymer is greatly reduced to the extent of forming a composition which is tacky.

At this point, i.e. after irradiation, the plate is ready for use as a relief printing master. In use, it is inked and contacted with the surface to be imprinted as are relief printing masters known in the art. It should be noted, however, that the ink selected must be a non-solvent for the polymer film lest the film be damaged by the ink.

An alternate method of forming images from the exposed plate is to sprinkle it with marking particles such as xerographic toner while the film is still tacky in the exposed areas. Any suitable toner or developer may be used such as that disclosed in U.S. Pat. Nos. 2,788,288; 3,079,342 and U.S. Pat. RE. No. 25,136. The particles can then be transferred to another surface by contacting the surface with the plate to transfer the particles. In another method of using the exposed plate to transfer its image, the tacky areas are offset onto a receiver sheet which is toned with a powdery marking material. Alternatively, the degradable polymer can be mixed with pigment particles before formation of the film so that the exposed film will transfer a visible image upon contact with a transfer media such as paper.

The invention is further illustrated by the following examples:

EXAMPLE I

A printing plate is prepared by applying a solution of 0.5 gm. poly(acetaldehyde) having a molecular weight of approximately 447,000 and 0.004 gm. of benzophenone in 10 milliliters of benzene to an aluminum substrate. The solvent is allowed to evaporate leaving a film of approximately 25 $\mu$ in thickness on the substrate.

The plate is irradiated through an aluminum stencil with a 100 Watt high pressure mercury arc emitting in the ultraviolet region at about 3650 A to provide ultraviolet radiation to the exposed areas having an intensity of approximately $1.2 \times 10^{17}$ photons/cm.$^2$/sec. Visible depressions are observed in the exposed areas after about 20 seconds. After 60 seconds, irradiation is terminated with depressions of approximately 15 to 25 $\mu$ being observed in the exposed areas. Upon placing the plate on a revolving drum and contacting it with paper while applying pressure the polymer is removed in the exposed areas resulting in depressions down to the substrate in the exposed areas.

The plate is inked and used as a printing master to provide ink transfer in the non-exposed areas while the areas corresponding to the exposed portions of the plate remain blank.

EXAMPLE II

Portions of the plate prepared as described in Example I are exposed as previously described except that the period of exposure is 600 seconds. The exposed plate is used as a printing master with the results being as previously described. However, the image produced is not as distinct as that previously obtained indicating that the 600 second exposure time is greater than that which would be preferred for optimum clarity.

EXAMPLE III

A plate prepared in Example I is irradiated through a positive transparency for 600 seconds. Depressions are observed in the exposed areas in the configuration of a negative image of that on the transparency. The plate is inked and used as a printing master thereby transferring ink in the configuration of the non-exposed areas.

EXAMPLE IV

A solution of poly(acetaldehyde) and benzophenone is prepared by adding 0.5 gm. of polymer and 0.002 gm. of photosensitizer to 10 milliliters of benzene. The solution is spread upon an aluminum substrate and the solvent allowed to evaporate to form a plate having a film ranging from 25 to 125 $\mu$ in thickness on its surface.

The plate is irradiated, as previously described, through a negative transparency for 600 seconds. Depressions are noted in the exposed areas which become deeper upon contacting the plate with paper. The plate is inked and copies are made which bear a positive image due to the use of a negative transparency. The image produced is more distinct than that previously prepared with a 600 second exposure time due to the lower concentration of photosensitizer.

What is claimed is:

1. A method for the preparation of a relief printing master which comprises exposing a printing plate to actinic radiation in an imagewise manner, wherein said plate comprises a substrate having on its surface a film of a composition comprising:
   a. a degradable polymer containing segments characterized by the structural formula:

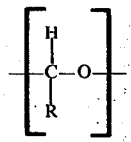

wherein R is H, an alkyl hydrocarbon radical of 1 to 6 carbon atoms, a chlorinated or fluorinated aliphatic hydrocarbon of 1 to 6 carbon atoms or a cyano substituted aliphatic hydrocarbon radical of 1 to 5 carbon atoms and,
   b. a photosensitizer which is capable upon exposure to actinic radiation of assuming the $^3(n, \pi^*)$ or $^1(n, \pi^*)$ state and extracting a hydrogen atom from the polymer backbone, thereby causing the polymer to degrade and form depressions in the film in the exposed areas.

2. The method of claim 1 wherein R is hydrogen, ethyl, n-propyl, isopropyl, butyl, pentyl or hexyl.

3. The method of claim 1 wherein R is chloromethyl, dichloromethyl, chloroethyl, chloropropyl, chloropentyl, trifluoromethyl, trifluoroethyl, heptafluoropropyl, chlorodifluoromethyl, or fluorohexyl.

4. The method of claim 1 wherein R is cyanomethyl, betacyanoethyl, cyanobutyl or cyanopentyl.

5. The method of claim 1 wherein the degradable polymer is a homopolymer characterized by the structural formula:

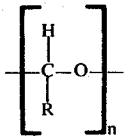

wherein R is as defined above and n is a number representing the degree of polymerization.

6. The method of claim 5 wherein n is from 20 to 20,000.

7. The method of claim 1 wherein the degradable polymer is a copolymer or block copolymer containing degradable segments characterized by the foregoing formula.

8. The method of claim 7 wherein the degradable segments are copolymerized with styrene, isoprene, methylstyrene methylmethacrylate, phenyl isocyanate or ethyl isocyanate.

9. The method of claim 1 wherein the photosensitizer is a carbonyl compound with a reactive $^3(n, \pi^*)$ state.

10. The method of claim 1 wherein the plate is exposed for a period of from 10 to 600 seconds.

11. The method of claim 1 wherein the polymer is polyacetaldehyde and the photosensitizer is benzophenone.

12. The method of claim 11 wherein the actinic radiation is ultraviolet light having a wavelength of from 250 to 370 nm.

13. The method of claim 1 wherein the photosensitizer is an aromatic amine having a reactive $^1(n, \pi^*)$ state.

* * * * *